(12) United States Patent
Halbutogullari et al.

(10) Patent No.: US 7,376,927 B2
(45) Date of Patent: May 20, 2008

(54) MANHATTAN ROUTING WITH MINIMIZED DISTANCE TO DESTINATION POINTS

(75) Inventors: Alper Halbutogullari, Santa Clara, CA (US); Timur Ceylan, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 408 days.

(21) Appl. No.: 11/151,045

(22) Filed: Jun. 13, 2005

(65) Prior Publication Data

US 2006/0294486 A1    Dec. 28, 2006

(51) Int. Cl.
    G06F 17/50         (2006.01)
(52) U.S. Cl. .............................. 716/12; 716/2; 716/10; 716/13; 716/14
(58) Field of Classification Search .................... 716/2, 716/9, 10, 12, 13
    See application file for complete search history.

(56) References Cited

U.S. PATENT DOCUMENTS

| | | | | |
|---|---|---|---|---|
| 3,621,208 A | * | 11/1971 | Donald ......................... | 716/12 |
| 5,587,922 A | * | 12/1996 | Hendrickson et al. ......... | 716/2 |
| 5,757,656 A | * | 5/1998 | Hershberger et al. ......... | 716/13 |
| 6,178,539 B1 | * | 1/2001 | Papadopoulou et al. ....... | 716/7 |
| 6,412,100 B1 | * | 6/2002 | Sasagawa et al. ............. | 716/9 |
| 6,473,891 B1 | * | 10/2002 | Shively ........................ | 716/12 |
| 6,513,149 B1 | | 1/2003 | Donato ........................ | 716/12 |
| 6,588,003 B1 | * | 7/2003 | Tetelbaum .................... | 716/10 |
| 6,591,411 B2 | * | 7/2003 | Alpert et al. .................. | 716/13 |
| 6,594,811 B2 | * | 7/2003 | Katz ........................... | 716/12 |
| 6,625,611 B1 | * | 9/2003 | Teig et al. .................... | 707/102 |
| 6,651,237 B2 | * | 11/2003 | Cooke et al. .................. | 716/13 |
| 6,851,099 B1 | * | 2/2005 | Sarrafzadeh et al. .......... | 716/10 |
| 7,200,827 B1 | * | 4/2007 | Ku et al. ....................... | 716/9 |
| 2005/0081173 A1 | * | 4/2005 | Peyran ......................... | 716/9 |
| 2006/0277520 A1 | * | 12/2006 | Gennari ........................ | 716/21 |

OTHER PUBLICATIONS

Sherwani N A et al, "Clock Layout for High-Performance ASIC Based on Weighted Center Algorithm", ASIC Conference and Exhibit, 1991 Proceddings, Fourth Annual IEEE International Rochester, NY, USA 23-27, Sep. 1991, New York, NY, USA, IEEE, US, Sep. 23, 1991, pp. P15-5.1-P15-5.4, XP010048523, ISBN: 0-7803-0101-3.

Ellis G et al, " A Hierarchical Decomposition Methodology for Single-Stage Clock Circuits", Custom Integrated Circuits Conference, 1997, Proceedings of the IEEE 1997 Santa Clara, CA, USA May 5-8, 1997, New York, NY, USA, IEEE, US, May 5, 1997, pp. 115-118, XP010235274, ISBN: 0-7803-3669-0.

(Continued)

*Primary Examiner*—Jack Chiang
*Assistant Examiner*—Helen Rossoshek
(74) *Attorney, Agent, or Firm*—Monica H. Choi

(57) ABSTRACT

For routing points to a center point, the points are grouped into a respective set disposed within each quadrant. Each point is Manhattan routed to any other point having a minimum Manhattan distance within a rectangle defined by each point and the center point, to result in at least one initial end point in each quadrant having at least one of the points. The at least one initial end point is Manhattan routed together to result in a respective final end point in each quadrant having at least one of the points. The respective final end points are routed to the center point with minimized routing distance.

14 Claims, 8 Drawing Sheets

OTHER PUBLICATIONS

Kahng A B et al, " A New Class of Iterative Steiner Tree Heuristics with Good Performance", IEEE Transactions on Computer Aided Design of Integrated Circuits and Systems, IEEE Service Center, Piscataway, NJ, US, vol. 11, No. 7, Jul. 1, 1992, pp. 893-902, XP000288551, ISSN: 0278-0070.

Elaheh Bozorgzadeh et al, "Creating and Exploiting Flexibility in Rectilinear Steiner Trees", IEEE Transactions on Computer Aided Design of Integrated Circuits and Systems, IEEE Service Center, Piscataway, NJ, US, vol. 22, No. 5, May 2003, pp. 605-615, XP011070725, ISSN: 0278-0070.

Jingsheng Cong et al, "Provably Good Performance-Driven Global Routing", IEEE Transactions on Computer Aided Design of Integrated Circuits and Systems, IEEE Service Center, Piscataway, NJ, US, vol. 11, No. 6, Jun. 1, 1992, pp. 739-752, XP000288536, ISSN: 0278-0070.

Cong J et al, "Performance Optimization of VLSI Interconnect Layout", Integration, the VLSI Journal, North-Holland Publishing Company, Amsterdam, NL, vol. 21, No. 1, Nov. 1996, pp. 1-94, XP004015651, ISSN: 0167-9260.

Hwang F K, "A Primer of the Euclidean Steiner Problem" Annals of Operation Research Switzerland, vol. 33, No. 1-4, Dec. 1991, pp. 73-84, XP002391142, ISSN: 0254-5330.

Cohoon J P et al, "Critical Net Routing", Proceedings of the International Conference on Computer Design-VLSI in Computers and Processors, Cambridge MA, Oct. 14-16, 1991, Los Alamitos, IEEE Comp. Soc. Press, US, Oct. 14, 1991, pp. 174-177, XP010025202, ISBN: 0-8186-2270-9.

Ellis Horowitz and Sartaj Sahni, "Fundamentals of Computer Algorithms" pp. 241-275, 1998, Computer Science Press, XP002392397, ISBN: 0-7167-8316-9.

Pages 430-433 of book entitled "Algorithms for VLSI Physical Design Automation", 3$^{rd}$ Edition, 2001, by Naveed Sherwani, published by Kluwer Academic Publishers.

* cited by examiner

MANHATTAN ROUTING WITH MINIMIZED DISTANCE TO DESTINATION POINTS

TECHNICAL FIELD

The present invention relates generally to routing technology, and more particularly to routing points to a center point with minimized Manhattan distance, for example application in integrated circuit wiring.

BACKGROUND OF THE INVENTION

Prior art routing schemes such as those based on a geometric matching algorithm r a weighted center algorithm strive to equalize a respective delay to each of a plurality of points. Such equalized delay is advantageous for minimizing skew of a signal reaching each point.

FIG. 1A shows an integrated circuit 102 with a plurality of points P1, P2, P3, and P4 to receive a common signal such as a clock signal for example. Such points P1, P2, P3, and P4 indicate locations of nodes of the integrated circuit 102 inputting the common clock signal.

Referring to FIG. 1B, in the geometric matching algorithm, a first segment 104 is drawn between two nearest points P1 and P2, and a second segment 106 is drawn between two nearest points P3 and P4. In addition, a third segment 108 is drawn between the mid-points of the segments 104 and 106.

Such segments 104, 106, and 108 indicate wiring between the points P1, P2, P3, and P4. The common signal is tapped into a point 110 along the third segment 108 to result in equal delay from such a point 110 to each of the points P1, P2, P3, and P4. For example, if the length of the segments 104 and 106 are equal, then the point 110 is the mid-point of the segment 108. Otherwise, the location of the point 110 is adjusted along the length of the segment 110 until the distance from the point 110 along the segment 110 and one of the segments 104 and 106 is equal for each of the points P1, P2, P3, and P4.

As a result, if the common signal is input at the point 110, the common signal reaches each of the points P1, P2, P3, and P4 with equalized delay and thus with minimized skew. The prior art routing schemes such as the geometric matching algorithm or the weighted center algorithm strive to equalize the wiring distance to the points of the integrated circuit, but do not strive to minimize the wiring length to the points of the integrated circuit. However, in some integrated circuits, minimizing the wiring length may be important. For example, minimizing the wiring length may be important for minimizing area, complexity, and signal delay of the integrated circuit.

SUMMARY OF THE INVENTION

Accordingly, a plurality of points is routed to a center point with minimized distance, according to aspects of the present invention.

In a general aspect of the present invention, the points are grouped into a respective set disposed within each of at least one quadrant having at least one of the points. In addition, each point is Manhattan routed to any other point having a minimum Manhattan distance within a rectangle defined by each point and the center point, to result in at least one initial end point in a quadrant having at least one of the points.

In a further aspect of the present invention, the at least one initial end point in a quadrant is Manhattan routed together to result in a final end point that is closest to the center point.

In one embodiment of the present invention, such steps are performed for each quadrant for determining a respective final end point for each quadrant having at least one of the points. For example, such steps are performed in parallel for each of the at least one quadrant.

In an additional aspect of the present invention, each respective final end point is Manhattan routed to the center point.

In a further embodiment of the present invention, minimized routing distance is determined for routing together the at least one initial end point in a quadrant and for routing each respective final end point to the center point.

In one embodiment of the present invention, a data processor and a memory device are used to automate such a process of determining the routing of the points to the center point.

The present invention may be used to particular advantage for wiring in an integrated circuit. In that case, each of the points is a respective node of the integrated circuit, and the center point is a location of a signal source for the integrated circuit. However, the present invention may also be used for other applications desiring routing points to a center point with minimized distance.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, 8, and 9 refer to elements having similar structure and function.

DETAILED DESCRIPTION

Figure 1A:
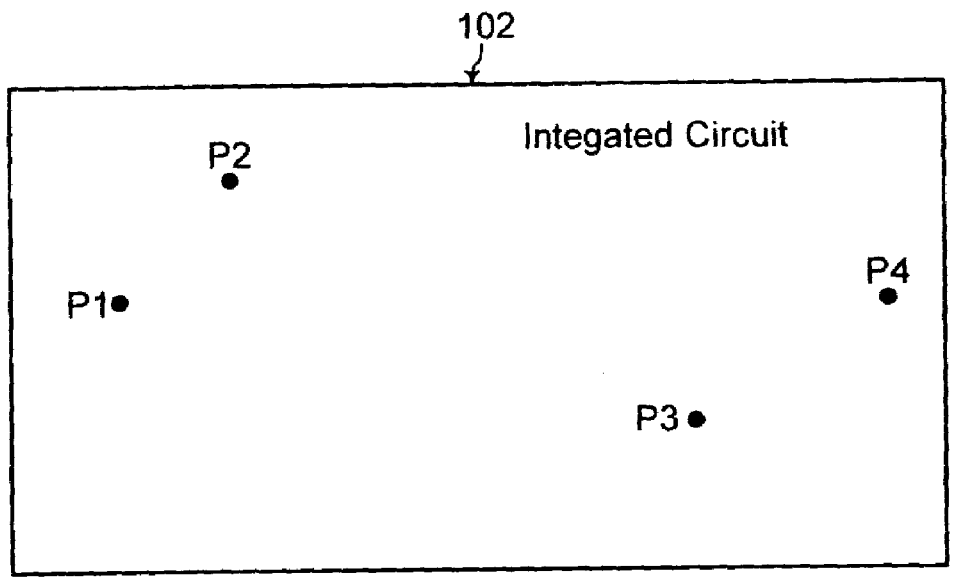
FIGS. 1A and 1B illustrate the geometric matching algorithm for coupling a common signal to a plurality of points with equalized delay, according to the prior art.
Figure 1B:
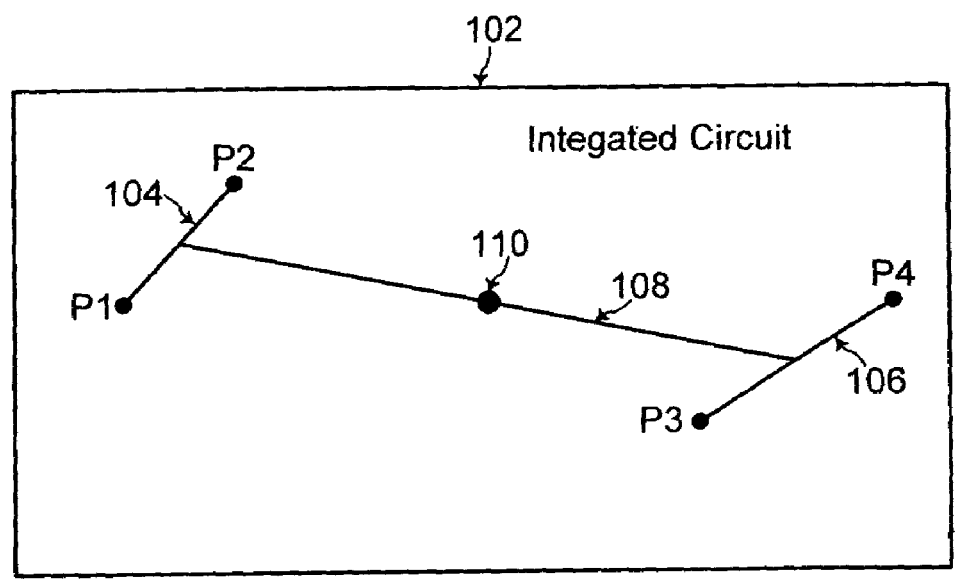
Figure 2:
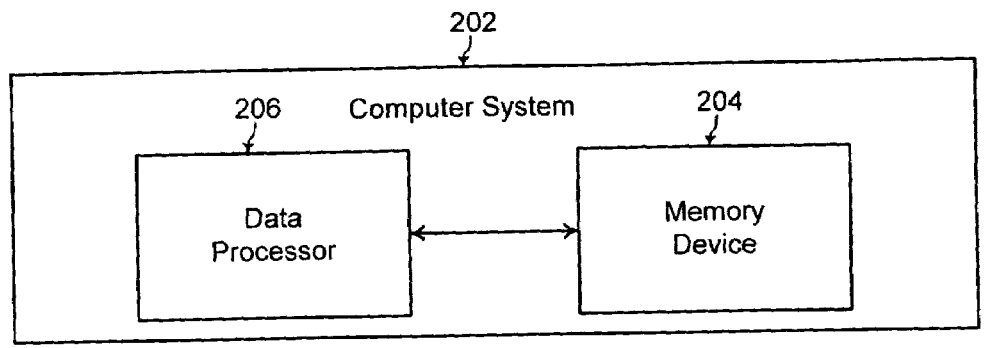
FIG. 2 shows a computer system including a data processor that performs steps for routing a plurality of points to a center point with minimized distance, according to an embodiment of the present invention.

Referring to FIG. 2, a computer system 202 includes a memory device 204 and a data processor 206 for performing a routing process, according to an embodiment of the present invention. A memory device and a data processor in a computer system are individually known to one of ordinary skill in the art of electronics.

According to an embodiment of the present invention, the memory device 204 has sequences of instructions stored thereon (in the form of a software application for example). Such a software application may be a CAD (computer assisted design) routing application for example. Execution of the sequences of instructions stored in the memory device 204 by the data processor 206 causes the data processor 206 to perform the steps of the flow-chart of FIG. 3 for routing a plurality of points to a center point.

Figure 4:
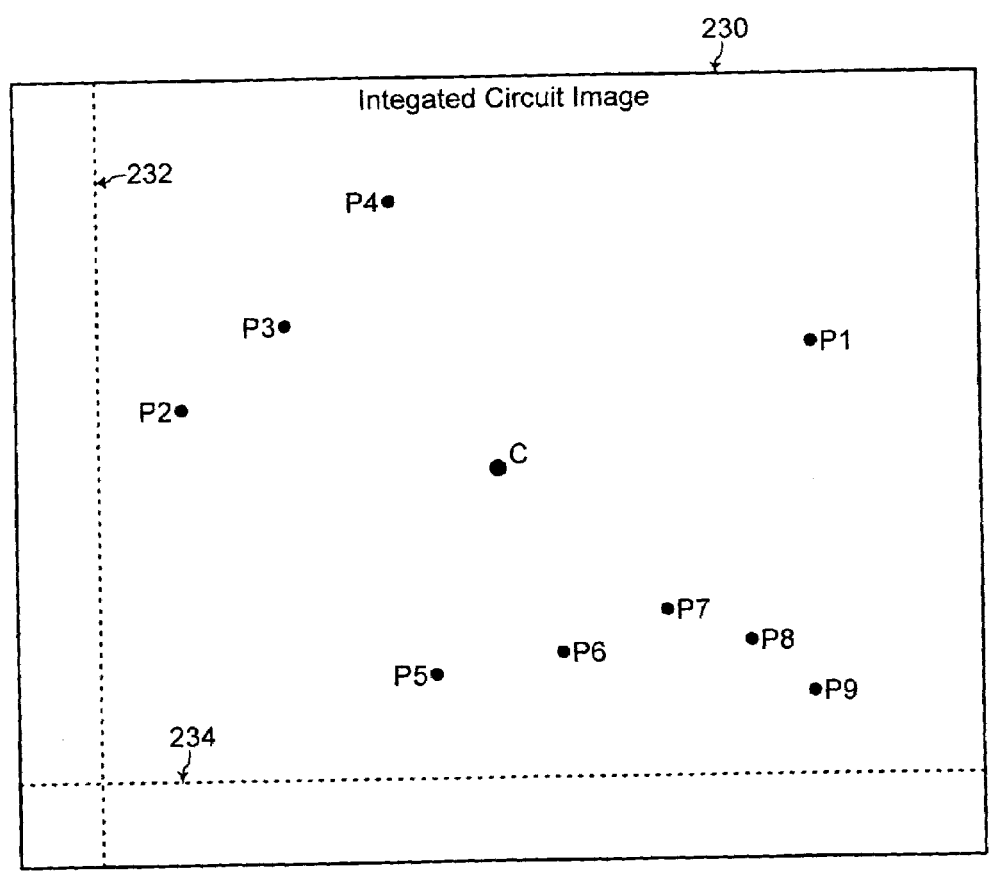
FIGS. 4, 5, 6, 7, 8, and 9 illustrate incremental routing of the plurality of points with each other and finally to the center point during steps of the flow-chart of FIG. 3, according to an embodiment of the present invention.
Figure 3:
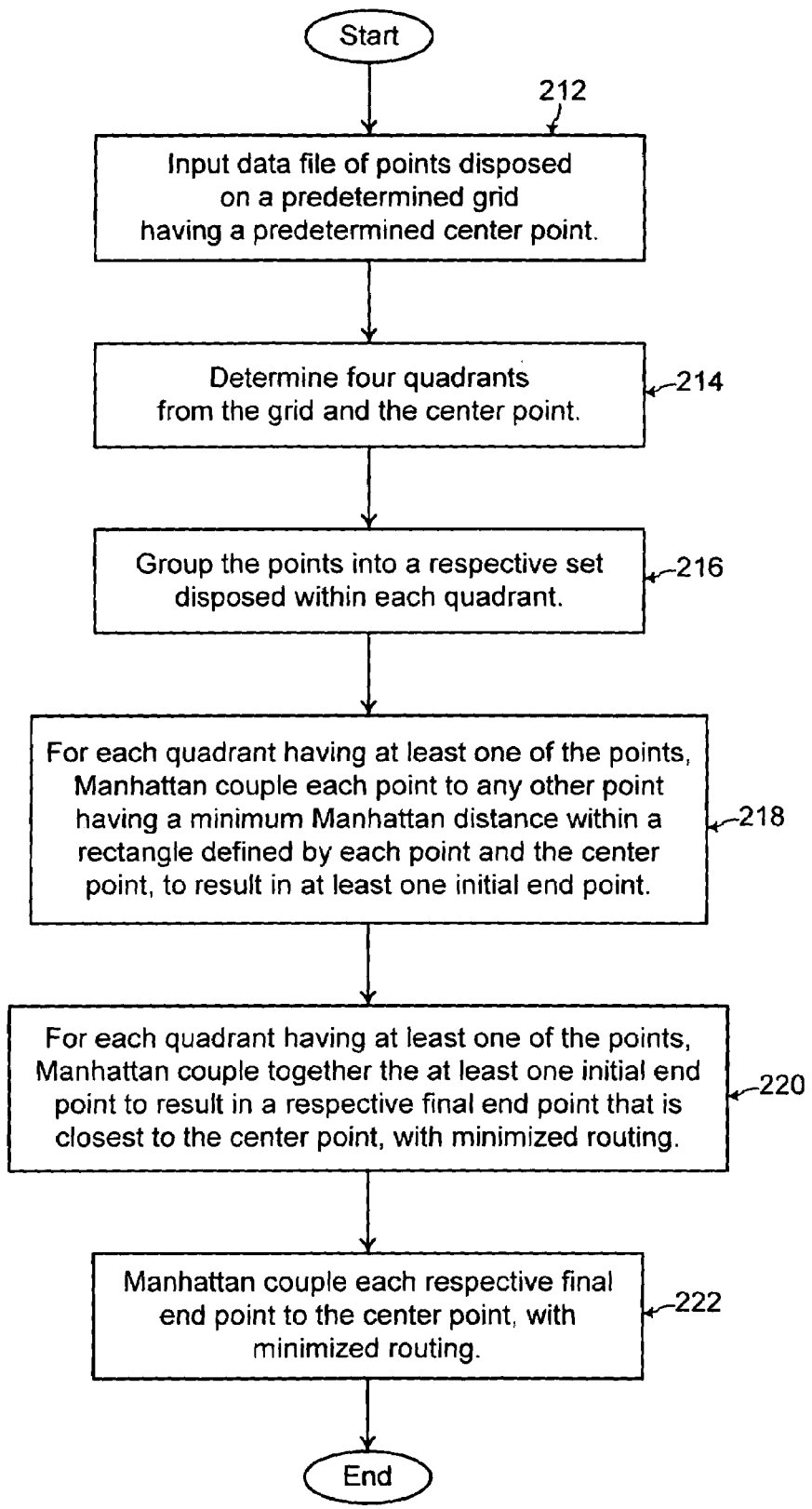
FIG. 3 shows a flow-chart of steps performed by the data processor of FIG. 2, according to an embodiment of the present invention.

Referring to FIGS. 2 and 3, the data processor 206 inputs a data file of points disposed on a predetermined grid having a predetermined center point (step 212 of FIG. 3). Referring to FIG. 4, the data file may be generated from an image of an integrated circuit 230. In that case, a plurality of points P1, P2, P3, P4, P5, P6, P7, P8, and P9 represent nodes of the integrated circuit 230, and the center point C indicates a location of a signal source to be coupled to such nodes of the integrated circuit 230.

The grid of the integrated circuit 230 is dictated by lay-out constraints of the integrated circuit 230. For example, objects such as wiring in the lay-out of the integrated circuit 230 may be constrained to be disposed parallel to such grids of the integrated circuit 230. A vertical line 232 and a horizontal line 234 are example grids in the image of the integrated circuit 230.

Figure 5:
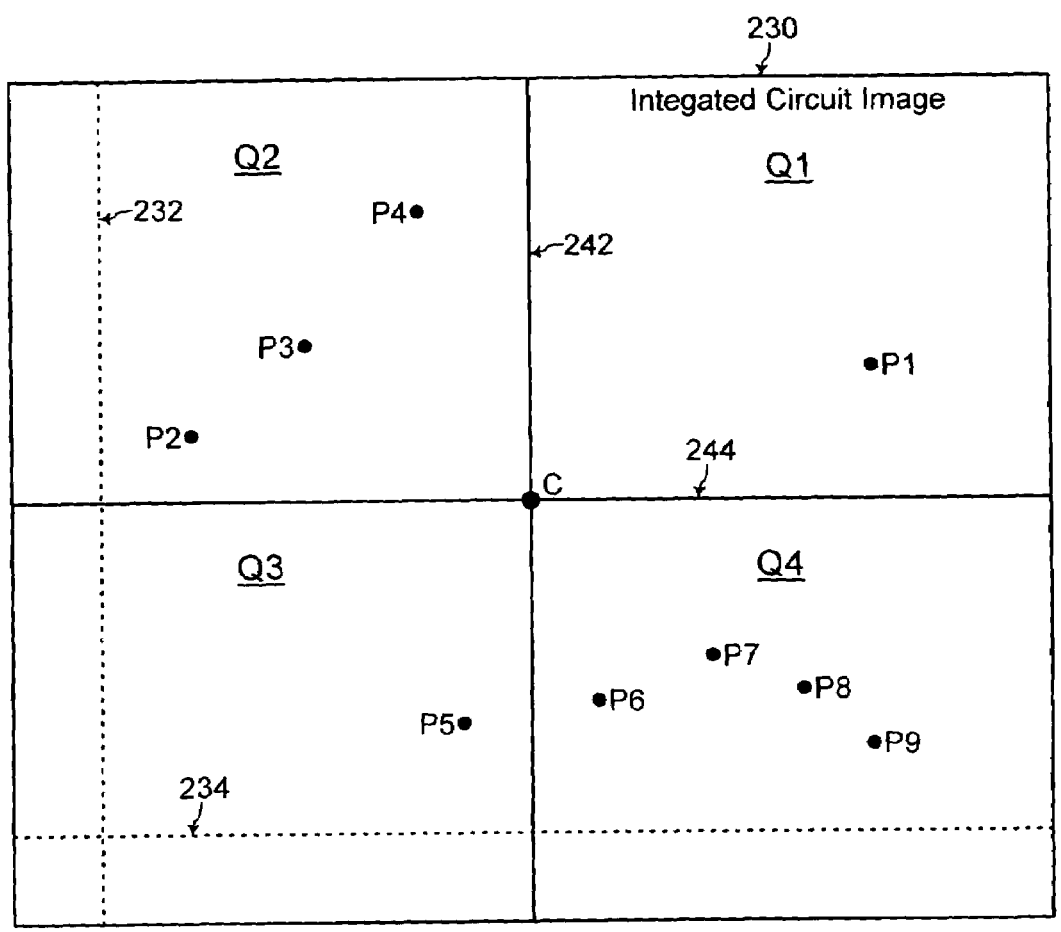

Referring to FIGS. 2, 3, and 5, the data processor 206 then determines four quadrants Q1, Q2, Q3, and Q4 from the image of the integrated circuit 230 (step 214 of FIG. 3). Referring to FIG. 5, a Y-axis 242 and an X-axis 244 are drawn through the center point C. The Y-axis 242 through the center point C is constrained to be parallel to the vertical grid line 232, and the X-axis 244 through the center point C is constrained to be parallel to the horizontal grid line 234.

A first quadrant Q1 is to the upper right of such Y-axis 242 and X-axis 244, and a second quadrant Q2 is to the upper left of such Y-axis 242 and X-axis 244. Similarly, a third quadrant Q3 is to the lower left of such Y-axis 242 and X-axis 244, and a fourth quadrant Q4 is to the lower right of such Y-axis 242 and X-axis 244.

The data processor 206 further groups the points P1, P2, P3, P4, P5, P6, P7, P8, and P9 into a respective set disposed within each of the quadrants Q1, Q2, Q3, and Q4 (step 216 of FIG. 3). Referring to FIG. 5, the point P1 forms a first set disposed within the first quadrant Q1. The points P2, P3, and P4 form a second set disposed within the second quadrant Q2. The point P5 forms a third set disposed within the third quadrant Q3. The points P6, P7, P8, and P9 form a fourth set disposed within the fourth quadrant Q4.

For each quadrant having at least one of the points P1, P2, P3, P4, P5, P6, P7, P8, and P9, the data processor 206 Manhattan routes each point to any other point having a minimum Manhattan distance within a rectangle defined by each point and the center point (step 218 of FIG. 3). Any wiring on the integrated circuit 230 is constrained to be parallel to the X-axis 244 or the Y-axis 242. Such routing parallel to the X-axis 244 or the Y-axis 242 is referred to as "Manhattan routing". The sum of any routing distance parallel to the X-axis 244 and/or the Y-axis 242 is referred to as "Manhattan distance". Manhattan distance is an example of routing distance. Manhattan routing and Manhattan distance are individually known to one of ordinary skill in the art of integrated circuits.

Figure 6:
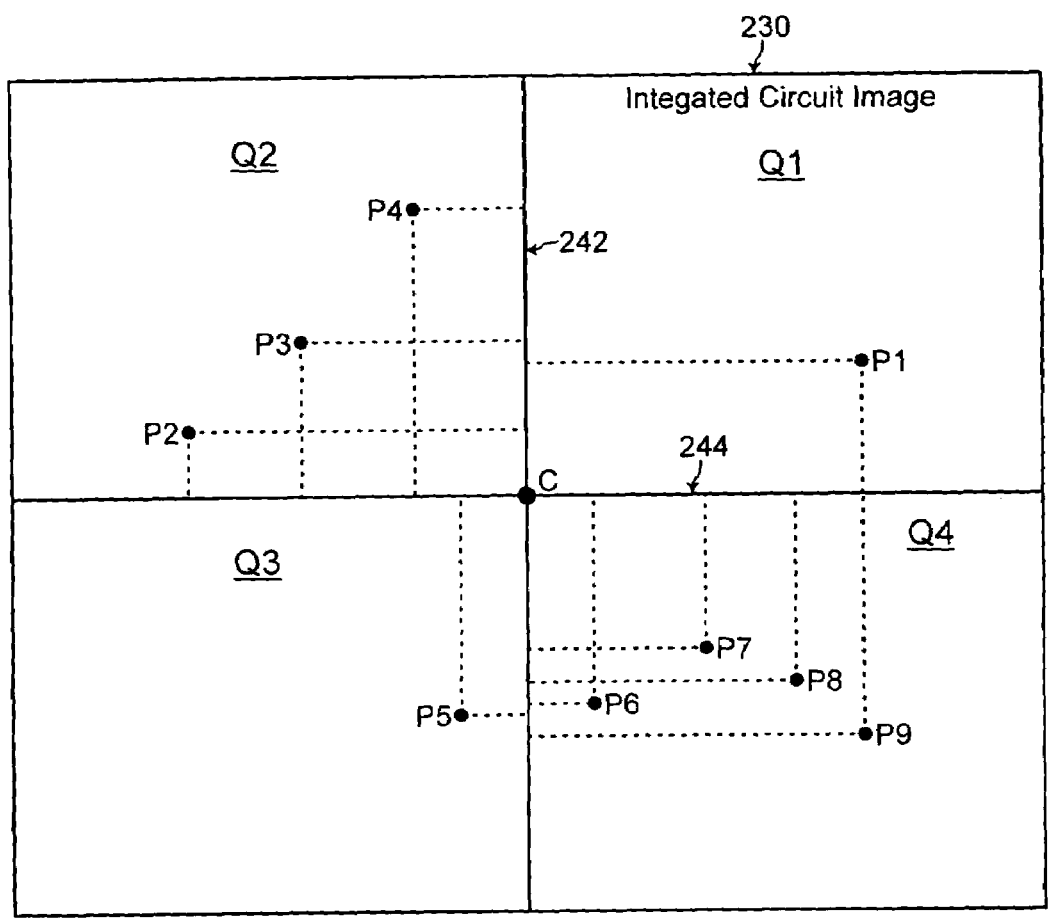

Referring to FIGS. 3 and 6, for such a step 218 in FIG. 3, each of the points P1, P2, P3, P4, P5, P6, P7, P8, and P9 and the center point C defines a respective rectangle as outlined with dashed lines in FIG. 6. If any points are disposed within the respective rectangle for a point, that point is Manhattan routed to a nearest point within that rectangle.

In the first quadrant Q1, no other point is within the rectangle for point P1. Thus, just the point P1 remains as an initial end point within the first quadrant Q1. In the second quadrant Q2, no other point is within the rectangles for points P2, P3, and P4. Thus, just the points P2, P3, and P4 remain as initial end points within the second quadrant Q2. In the third quadrant Q3, no other point is within the rectangle for point P5. Thus, just the point P5 remains as an initial end point within the third quadrant Q3.

Figure 7:
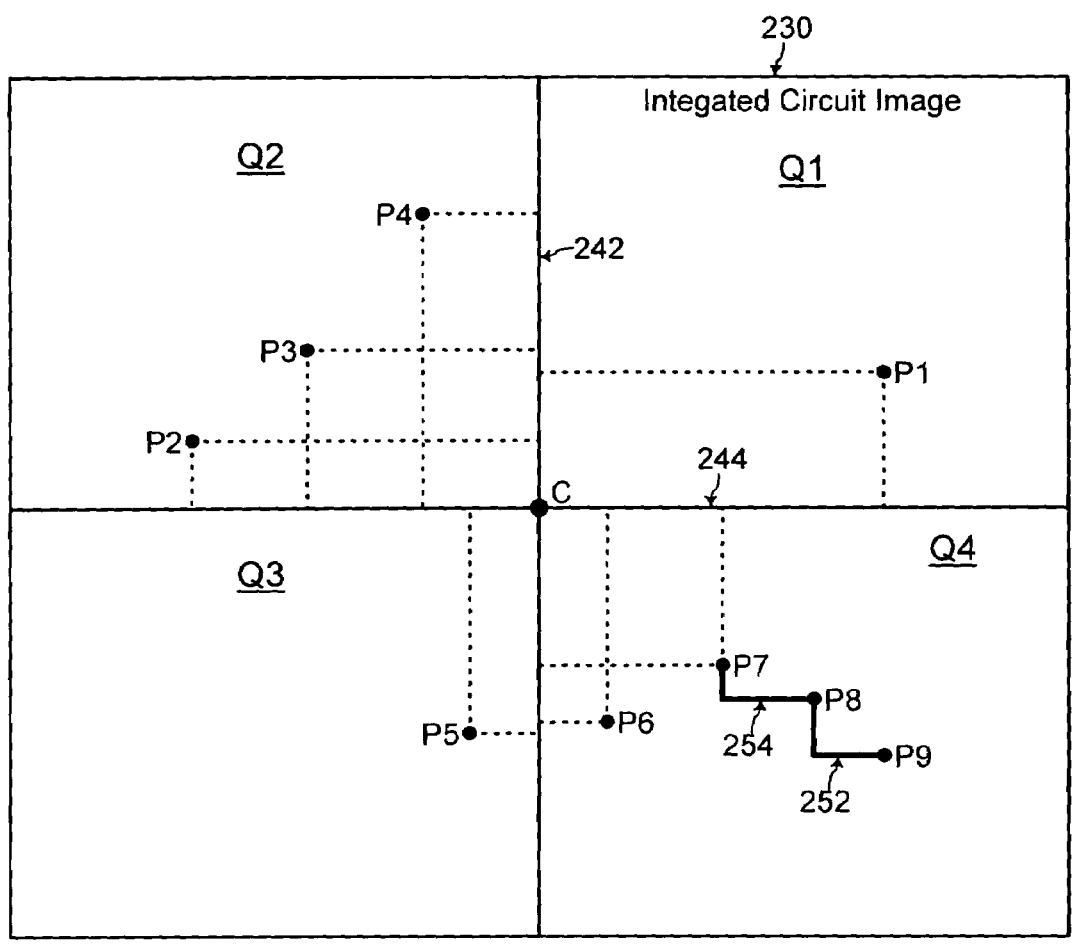

In the fourth quadrant Q4, points P6, P7, and P8 are disposed within the rectangle for point P9. Of such points P6, P7, and P8, point P8 has the lowest Manhattan distance from the point P9. Thus, referring to FIGS. 6 and 7, point P8 is Manhattan routed with Manhattan routing 252 to point P9.

Additionally in the fourth quadrant Q4 of FIG. 6, the point P7 is disposed within the rectangle for point P8. Thus, referring to FIGS. 6 and 7, point P7 is Manhattan routed with Manhattan routing 254 to point P8. Since points P8 and P9 are routed to at least one other point, routing of such points P8 and P9 to the center point C is guaranteed through routing of the point P7 to the center point C. Thus, points P8 and P9 are no longer considered as needing routing to the center point C.

Additionally, since point P7 has lower Manhattan distance to the center point C than points P8 and P9, points P7 and P6 remain as initial end points within the fourth quadrant Q4. No other point is within the rectangles for points P6 and P7. Thus, the points P6 and P7 remain as initial end points within the fourth quadrant Q4.

After determination of at least one initial end point for each quadrant having at least one of the points P1, P2, P3, P4, P5, P6, P7, P8, and P9 in step 218 of FIG. 3, the data processor 206 Manhattan routes together such at least one initial end point in each quadrant with minimized Manhattan distance. Such Manhattan routing of the at least one initial end point in each quadrant results in a respective final end point that is closest to the center point C in each quadrant (step 220 of FIG. 3).

Each of the first and third quadrants Q1 and Q3 has just one point P1 and P5, respectively, as an initial end point. Thus, the point P1 is a first final end point EP1 for the first quadrant Q1, and the point P5 is a third final end point EP3 for the third quadrant Q3.

In the second quadrant Q2, Manhattan routing between the initial end points P2, P3, and P4 with minimized Manhattan distance is determined along portions of rectangles of such points P2, P3, and P4. A first routing segment 262 Manhattan routes point P2 to a second final end point EP2, and a second routing segment 264 Manhattan routes point P4 to the second final end point EP2.

In addition, a third routing segment 266 Manhattan routes point P3 to the first routing segment 262. Note that the third routing segment 266 is chosen over a fourth routing segment 268 (shown in dashed lines in FIG. 8) to the second routing segment 264 because the third routing segment 266 has lower length than the fourth routing segment 268. The second final end point EP2 is closer to the center point C than the points P2, P3, and P4 in the second quadrant Q2.

In the fourth quadrant Q4, Manhattan routing between the initial end points P6 and P7 with minimized Manhattan distance is determined along portions of rectangles for such points P6 and P7. A fifth routing segment 272 Manhattan routes point P6 to a fourth final end point EP4, and a sixth routing segment 274 Manhattan routes point P7 to the fourth final end point EP4.

After determination of the respective final end points EP1, EP2, EP3, and EP4 in the quadrants Q1, Q2, Q3, and Q4, respectively, the data processor 206 Manhattan routes such final end points EP1, EP2, EP3, and EP4 to the center point C with minimized Manhattan distance (step 222 of FIG. 3). For example, the data processor 206 determines all possible Manhattan routing of the final end points EP1, EP2, EP3, and EP4 to the center point C.

Figure 8:
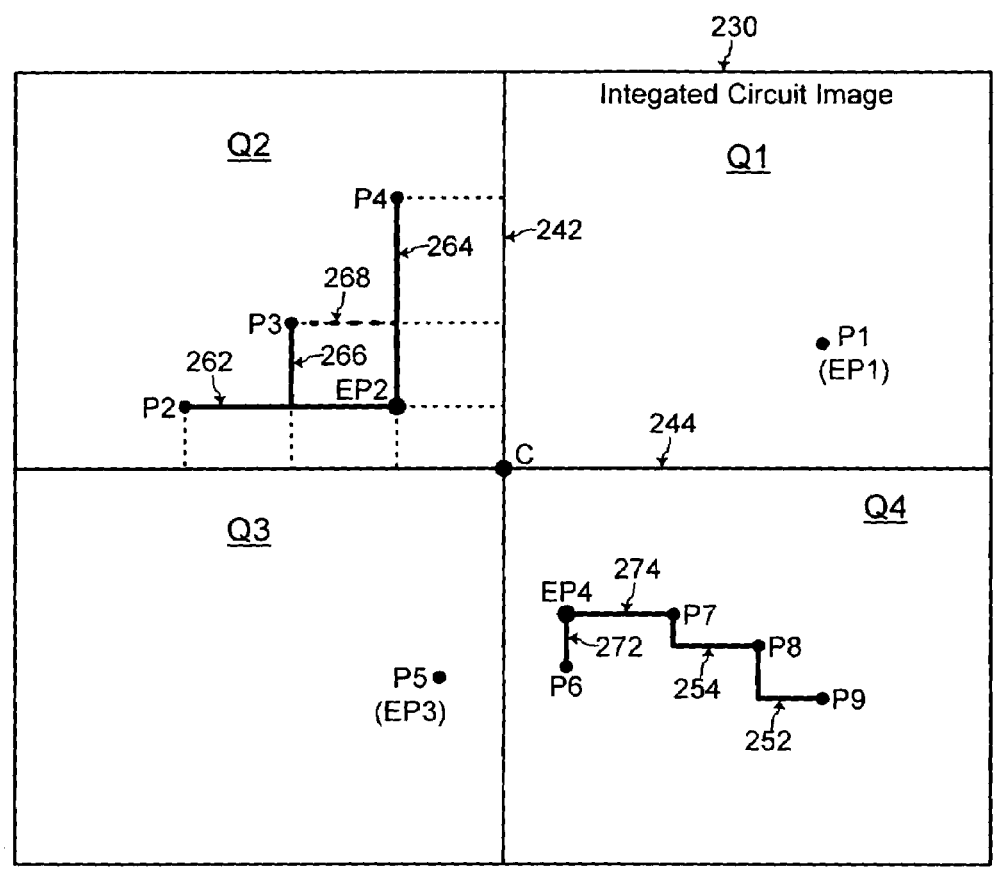
Figure 9:
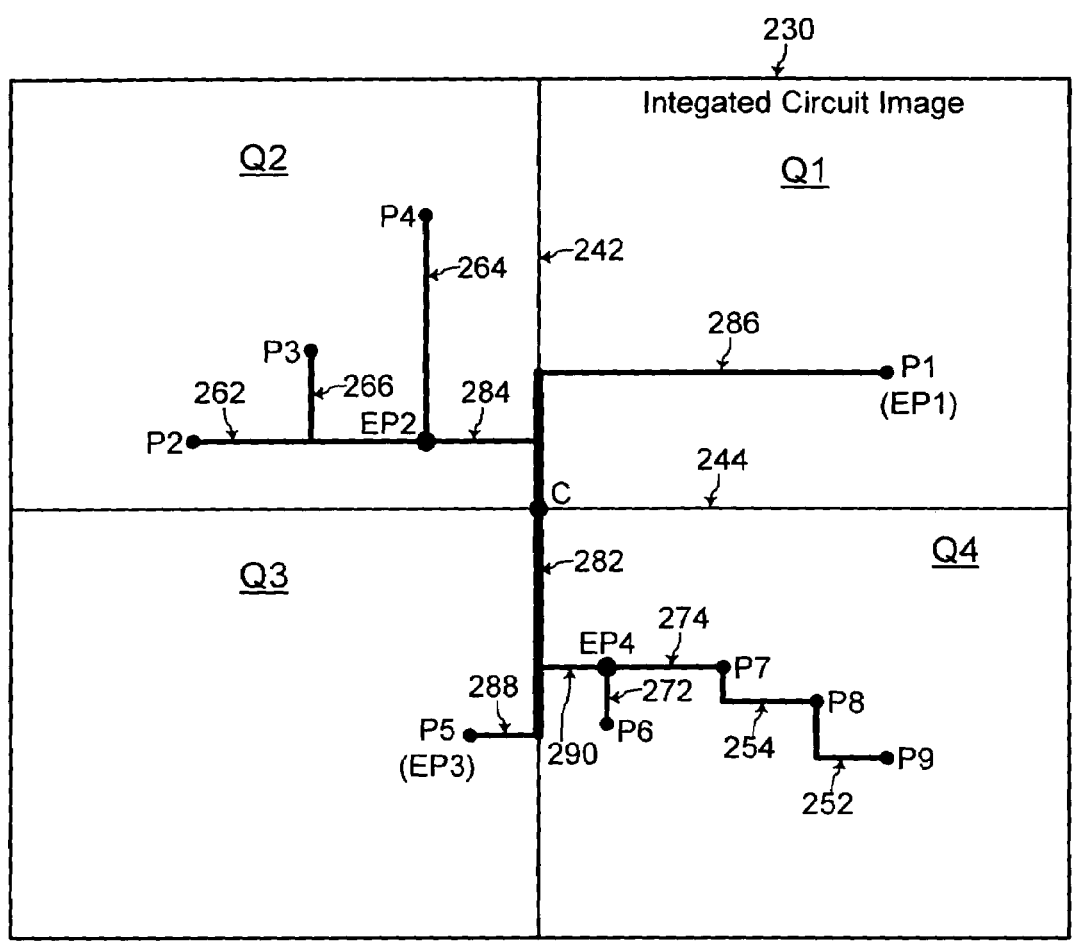

In addition, the data processor 206 determines which Manhattan routing results in minimized Manhattan distance. In the example of FIGS. 8 and 9, a vertical routing segment 282 (shown with a thick line in FIG. 3) is drawn along the Y-axis 242 between the Y-components of the final end points EP1 and EP3.

Furthermore, a first horizontal routing segment 284 is drawn from the second final end point EP2 to the vertical routing segment 282. Similarly, a second horizontal routing segment 286 is drawn from the first final end point EP1 to the vertical routing segment 282. Also, a third horizontal routing segment 288 is drawn from the third final end point EP3 to the vertical routing segment 282. Finally, a fourth horizontal routing segment 290 is drawn from the fourth final end point EP4 to the vertical routing segment 282.

In this manner, each of the points P1, P2, P3, P4, P5, P6, P7, P8, and P9 is Manhattan routed to the center point C with minimized Manhattan distance. For the application of wiring in an integrated circuit, each routing segment in FIG. 9 represents a wiring segment. Such minimized routing is advantageous for reducing the area, complexity, and signal delay of the integrated circuit 230. In one embodiment of the present invention, the data processor 206 performs steps 218 and 220 of FIG. 3 in parallel for each of the quadrants Q1, Q2, Q3, and Q4 having at least one of the points P1, P2, P3, P4, P5, P6, P7, P8, and P9 for faster processing time.

The foregoing is by way of example only and is not intended to be limiting. For example, the present invention has been described and illustrated for wiring in the integrated circuit 230. However, the present invention may also be used for any other application desiring routing points to a center point with minimized distance. In addition, any number and location of points illustrated and described herein is by way of example only, and the present invention may be used for any number and location of the points. Furthermore, the present invention may be used for minimizing routing distance for any subset of points that are deemed critical in an application.

The present invention is limited only as defined in the following claims and equivalents thereof.

We claim:

1. A method of routing a plurality of points to a center point for an integrated circuit layout, the method comprising:
   A. grouping the points into a respective set disposed within each of a plurality of quadrants, wherein the center point is a given location of a signal source for the integrated circuit, and wherein said points are given nodes of the integrated circuit receiving the signal from the center point, and wherein the quadrants are defined by a given lay-out grid of the integrated circuit and the center point;
   B. defining a respective rectangle from each of the points and borders of the respective quadrant for each of the points;
   C. Manhattan routing with wiring a first point to a second point when the first point is within the respective rectangle for the second point, for each of the points to define a respective set of at least one initial end point for each of the quadrants; and
   D. Manhattan routing with wiring the respective at least one initial end point to the center point within each quadrant such that a total Manhattan wiring between said points and the center point is minimized, wherein the signal from the center point is applied to said points via the total Manhattan wiring.

2. The method of claim 1, wherein the step D includes the steps of:
   Manhattan routing with wiring the respective at least one initial end point in each of the quadrants to form a respective final end point for each of the quadrants; and
   Manhattan routing with wiring each respective final end point to the center point.

3. The method of claim 1, wherein steps B, C, and D are performed in parallel for each of the quadrants.

4. The method of claim 3, wherein the quadrants include four quadrants.

5. The method of claim 1, wherein the given lay-out grid is defined by restraints for laying out wiring of the integrated circuit.

6. A computer system comprising:
   a processor; and
   a memory device having sequences of instructions stored thereon, wherein execution of the sequences of instructions by the processor causes the processor to route a plurality of points to a center point for an integrated circuit by performing the steps of:
   A. grouping the points into a respective set disposed within each of a plurality of quadrants, wherein the center point is a given location of a signal source for the integrated circuit, and wherein said points are given nodes of the integrated circuit receiving the signal from the center point, and wherein the quadrants are defined by a given lay-out grid of the integrated circuit and the center point;
   B. defining a respective rectangle from each of the points and borders of the respective quadrant for each of the points;
   C. Manhattan routing with wiring a first point to a second point when the first point is within the respective rectangle for the second point, for each of the points to define a respective set of at least one initial end point for each of the quadrants; and
   D. Manhattan routing with wiring the respective at least one initial end point to the center point within each quadrant such that a total Manhattan wiring between said points and the center point is minimized, wherein the signal from the center point is applied to said points via the total Manhattan wiring.

7. The computer system of claim 6, wherein the processor further performs during the step D the steps of:
   Manhattan routing with wiring the respective at least one initial end point in each of the quadrants to form a respective final end point for each of the quadrants; and
   Manhattan routing with wiring each respective final end point to the center point.

8. The computer system of claim 6, wherein the processor performs steps B, C, and D in parallel for each of the quadrants.

9. The computer system of claim 8, wherein the quadrants include four quadrants.

10. The computer system of claim 6, wherein the given lay-out grid is defined by restraints for laying out wiring of the integrated circuit.

11. An integrated circuit, comprising:
   a plurality of points with each point being a node of the integrated circuit;
   a center point at a given location of a signal source for the integrated circuit;
   a plurality of quadrants with the points grouped into a respective set disposed within each quadrant, wherein said points are given nodes of the integrated circuit receiving the signal from the center point, and wherein the quadrants are defined by a given lay-out grid of the integrated circuit and the center point;

Manhattan wiring between any first point and any second point for said points when the first point is within a respective rectangle defined by the second point and borders of a respective quadrant for the second point, to define a respective set of at least one initial end point for each of the quadrants; and Manhattan wiring between the respective initial end point to the center point within each quadrant such that a total Manhattan wiring between said points and the center point is minimized, wherein the signal from the center point is applied to said points via the total Manhattan wiring.

12. The integrated circuit of claim 11, wherein said Manhattan wiring includes:

Manhattan wiring between the respective at least one initial end point in each of the quadrants to form a respective final end point for each of the quadrants; and Manhattan wiring each respective final end point to the center point.

13. The integrated circuit of claim 11, wherein the quadrants include four quadrants.

14. The integrated circuit of claim 11, wherein the given lay-out grid is defined by restraints for laying out wiring of the integrated circuit.

* * * * *